United States Patent
Li et al.

(10) Patent No.: US 10,157,754 B2
(45) Date of Patent: Dec. 18, 2018

(54) LIQUID KNIFE CLEANING DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Dengtao Li, Beijing (CN); Jaeyun Jung, Beijing (CN); Shikai Wang, Beijing (CN); Dongseob Kim, Beijing (CN); Yadong Xu, Beijing (CN); Xuanqi Liang, Beijing (CN); Huadong Wang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 269 days.

(21) Appl. No.: 14/786,072

(22) PCT Filed: Apr. 10, 2015

(86) PCT No.: PCT/CN2015/076288
§ 371 (c)(1),
(2) Date: Oct. 21, 2015

(87) PCT Pub. No.: WO2016/082419
PCT Pub. Date: Jun. 2, 2016

(65) Prior Publication Data
US 2017/0154795 A1    Jun. 1, 2017

(30) Foreign Application Priority Data

Nov. 24, 2014 (CN) .......................... 2014 1 0682980

(51) Int. Cl.
*H01L 21/304* (2006.01)
*H01L 21/67* (2006.01)
(Continued)

(52) U.S. Cl.
CPC ........ *H01L 21/67051* (2013.01); *B08B 3/022* (2013.01); *B08B 5/02* (2013.01);
(Continued)

(58) Field of Classification Search
None
See application file for complete search history.

(56) References Cited

U.S. PATENT DOCUMENTS 5,993,547 A    11/1999  Sato
2003/0183250 A1*  10/2003  Rodney Chiu ........... B08B 3/02
                                                          134/30

FOREIGN PATENT DOCUMENTS

CN    101303968 A    11/2008
CN    201359681 Y    12/2009
(Continued)

OTHER PUBLICATIONS

English Machine Translation of JP2009-147260A.*
(Continued)

*Primary Examiner* — Michael E Barr
*Assistant Examiner* — Jason P Riggleman
(74) *Attorney, Agent, or Firm* — Ladas & Parry LLP (57) ABSTRACT

A liquid knife cleaning device is provided, and it includes a splash shield; a liquid knife, which is located under the splash shield; an oblique baffle, which is located between the splash shield and the liquid knife, and a lower side of which is fixedly bonded to the top of a blade of the liquid knife. The oblique baffle can act to isolate the liquid knife and the substrate on the delivery roll from a majority of water vapor, and droplets dripping on the oblique baffle can flow down (Continued)

along a slope of the oblique baffle, and will not drip on the substrate that has not been rinsed by the liquid knife. Effects of droplets on the uniformity of the substrate can be greatly reduced by the present technique, thereby enhancing the product quality.

15 Claims, 5 Drawing Sheets

(51) Int. Cl.
*B08B 3/02* (2006.01)
*B08B 5/02* (2006.01)
*G02F 1/13* (2006.01)
*H01L 21/677* (2006.01)
*G02F 1/1368* (2006.01)
*H01L 27/12* (2006.01)

(52) U.S. Cl.
CPC ...... *G02F 1/1303* (2013.01); *H01L 21/67023* (2013.01); *H01L 21/6776* (2013.01); *G02F 1/1368* (2013.01); *H01L 27/1259* (2013.01)

(56) References Cited

FOREIGN PATENT DOCUMENTS

| CN | 104362118 A | | 2/2015 |
|---|---|---|---|
| CN | 204167277 U | | 2/2015 |
| GB | 567417 | | 1/1946 |
| JP | 2009-147260 A | * | 7/2009 |

OTHER PUBLICATIONS

English machine translation of JP2009147260.*
International Search Report & Written Opinion Appln. No. PCT/CN2015/076288; dated Aug. 11, 2015.

* cited by examiner (Prior Art)

LIQUID KNIFE CLEANING DEVICE

TECHNICAL FIELD

Embodiments of the present invention relate to a liquid knife cleaning device.

BACKGROUND

Among flat panel display devices, Thin Film Transistor Liquid Crystal Displays (briefly called as TFT-LCDs) have the traits of small volume, low power consumption, relatively low manufacturing cost, irradiation-free, etc., and play a leading role in the current market for flat panel displays. Along with development of larger-scale glass substrates, in order to guarantee the qualified rate of products, each manufacturing process faces larger challenges.

Figure 1:
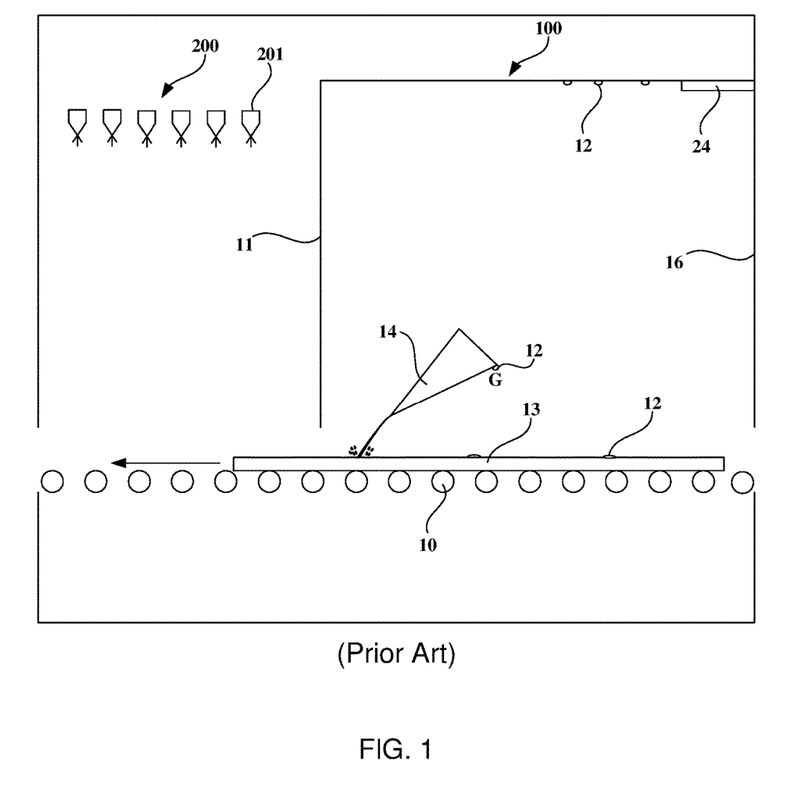
FIG. 1 is a structurally schematic view illustrating an existing cleaning equipment.

Wet etching is an important link in the course of manufacturing display panels, and an etching solution is used to etch off a metal region uncovered by photoresist at a substrate surface, so as to form a metal layer with a certain pattern. As illustrated in FIG. 1, equipments for cleaning the substrate after wet etching include a liquid knife cleaning device 100 and a spraying device 200. In the liquid knife cleaning device 100, a blade of a liquid knife 14 is in a linear shape, and capable of jetting out a uniform deionized water curtain, so as to fast rinse a substrate 13 on a delivery roll 10, and remove residual etching solution on the substrate 13. The spraying device 200 is disposed at the downstream side of the liquid knife cleaning device 199, and contains a plurality of nozzles 201, and deionized water sprayed out from the nozzles 201 can be used for showering the substrate on the delivery roll 10, so as to further clean up the substrate.

As illustrated in FIG. 1, an existing liquid knife cleaning device 100 mainly includes a supporting plate 24, an L-shaped splash shield 11 and a liquid knife 14. The supporting plate 24 is fixedly bonded to a sidewall 16 of a cleaning chamber, the top plate of the splash shield 11 is fixedly bonded to the supporting plate 24, and the liquid knife 14 is disposed below the splash shield 11, with a blade toward the delivery roll 10.

The defect lying in the above existing technology is, when the liquid knife cleaning device 100 is at work, water vapor is too apt to condense into droplets in the lower part of the splash shield 11 and at a G corner of the liquid knife 14, and dripping of droplets on the substrate 13 will slightly dilute the residual etching solution, so that the etching solution creates a chemical reaction with the substrate once more. This affects the uniformity of the substrate to a certain extent, and then affects quality of the product.

SUMMARY

A liquid knife cleaning device provided by an embodiment of the invention, which includes: a splash shield; a liquid knife, which is located under the splash shield; an oblique baffle, which is located between the splash shield and the liquid knife, and a lower side of which is fixedly bonded to the top of a blade of the liquid knife.

In some examples, the splash shield, the liquid knife and the oblique baffle are located in a cleaning chamber, the splash shield is fixed to a sidewall of the cleaning chamber, and a higher side of the oblique baffle is fixedly bonded to the sidewall of the cleaning chamber.

In technical solutions of embodiments of the invention, the oblique baffle can act to isolate the liquid knife and the substrate on the delivery roll from a majority of water vapor, and droplets dripping on the oblique baffle can flow down along a slope, and will not drip on the substrate that has not been rinsed. As compared with prior art, effects of droplets on the uniformity of the substrate can be greatly reduced by the present scheme, thereby enhancing the product quality.

In some examples, the oblique baffle includes at least two plate units; a vertical baffle is disposed at the intersection of top surfaces of two adjacent plate units, and a first guiding slot is formed by the vertical baffle and one of the plate units in a higher section. The first guiding slot can act to quickly guide the gathered deionized water to two sides of the liquid knife cleaning device.

In some examples, there is a first sealing gasket between a higher side of the oblique baffle and a sidewall of the cleaning chamber. The first sealing gasket can act to prevent droplets from flowing down from a gap between the oblique baffle and the sidewall of the cleaning chamber, and thus, droplets are prevented from dripping on the substrate and making a harmful effect on uniformity of the substrate.

In some examples, there is a second sealing gasket between a lower side of the oblique baffle and the top of a blade of the liquid knife, and a second guiding slot is formed between the oblique baffle, the second sealing gasket and the top of the blade of the liquid knife. The second guiding slot can act to quickly guide deionized water that is gathered at a bottom surface of the oblique baffle to two sides of the liquid knife cleaning device.

In some examples, the liquid knife cleaning device further includes a supporting plate fixedly bonded to a sidewall of the cleaning chamber, there is a third guiding slot on a top surface of the supporting plate; a top plate of the splash shield is fixedly bonded to the top surface of the supporting plate. When deionized water seeps into a gap between the splash shield and the supporting plate, it can be quickly discharged to two sides of the liquid knife cleaning device through the third guiding slot.

In some examples, blade of the liquid knife faces a gap between two adjacent delivery rolls. As such, when no substrate is placed on the delivery rolls, delivery rolls will not be impinged by deionized water curtain sprayed out of the blade of the liquid knife. Thus, splashback of liquid is reduced, and generation of water vapor is effectively reduced.

In some examples, the liquid knife cleaning device further includes a vertical baffle located under blade of the liquid knife, and height of the vertical baffle is lower than the delivery plane of the delivery rolls. Before the substrate is cleaned, the liquid knife needs to operate for a period of time firstly, so that deionized water curtain is sprayed evenly. Splashback of liquid can be effectively reduced by provision of the vertical baffle, thereby reducing generation of water vapor.

In some examples, the liquid knife cleaning device further includes a blow-off pipe located below the oblique baffle and above the delivery rolls; and an air blasting device for blasting airflow into the blow-off pipe. The air blasting device can act to blast dry and cold airflow into the blow-off pipe when no substrate is placed on delivery rolls, so that water vapor underneath the oblique baffle is blown off by the blow-off pipe, and condensation of droplets is decreased.

In some examples, there is a plurality of vent holes distributed in a wall of the blow-off pipe. Dry and cold airflow blasted into the blow-off pipe may be blown out from the plurality of vent holes. Thus, water vapor underneath the oblique baffle can be blown off in multiple directions, and the blowing-off effect is better.

In some examples, the splash shield includes a front side and a back side along the transferring direction of a substrate to be cleaned, the liquid knife is close to the front side of the splash shield, and a higher side of the oblique baffle is close to the back side of the splash shield.

In some examples, the cleaning chamber includes a front side and a back side along the transferring direction of a substrate to be cleaned, and the splash shield is fixed to a sidewall of the cleaning chamber on the back side.

BRIEF DESCRIPTION OF THE DRAWINGS

In order to illustrate the technical solution of the embodiments of the invention more clearly, the drawings of the embodiments will be briefly introduced below; it is obvious that the drawings as described below are only related to some embodiments of the invention, but are not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

For the sake of improving the uniformity of a substrate and then enhancing the product quality, a liquid knife cleaning device is provided by embodiments of the invention. In technical solutions of the present invention, an oblique baffle is provided between a splash shield and a liquid knife, a higher side of the oblique baffle is fixedly bonded to a sidewall of a cleaning chamber, and a lower side of the oblique baffle is fixedly bonded to the top of a blade of the liquid knife. The oblique baffle can serve to isolate the liquid knife and a substrate on a delivery roll from a majority of water vapor, and droplets dripping onto the oblique baffle may flow down along a slope, and will not drip onto a substrate that has not been rinsed by the liquid knife. Therefore, effects of droplets on uniformity of the substrate can be greatly reduced by the scheme, and the product quality is enhanced. In order to make objects, technical details and advantages of the invention more clear, hereinafter, the invention will be described further in detail by giving embodiments.

Figure 2:
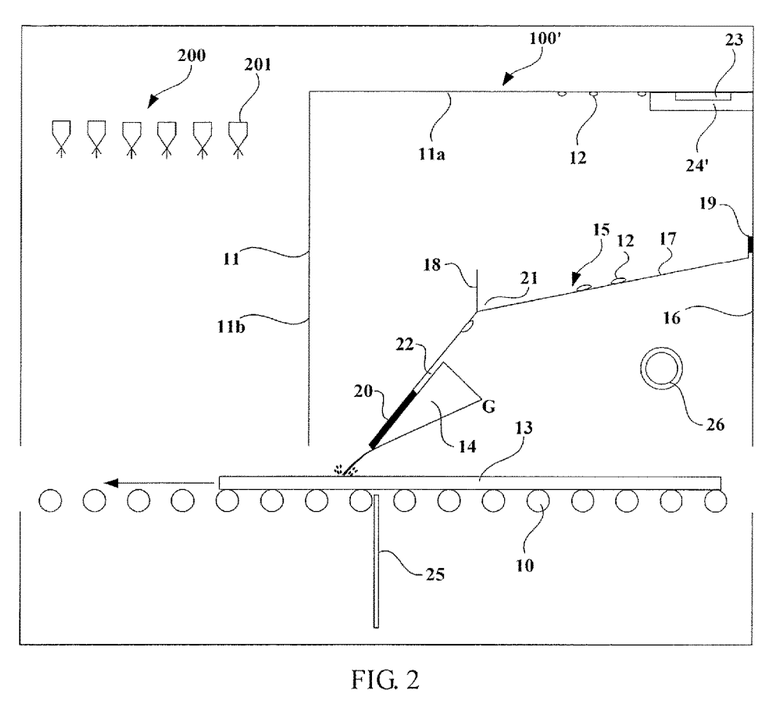
FIG. 2 is a structurally schematic view illustrating a cleaning equipment containing a liquid knife cleaning device according to an embodiment of the invention.

As illustrated in FIG. 2, according to an embodiment of the invention, there is provided a liquid knife cleaning device 100', which includes:

a splash shield 11;

a liquid knife 14, which is located under the splash shield 11;

an oblique baffle 15, which is located between the splash shield 11 and the liquid knife 14, and a lower side of the oblique baffle being fixedly bonded to the top of a blade of the liquid knife 14.

For example, all of the splash shield 11, the liquid knife 14 and the oblique baffle 15 are located in a cleaning chamber. A higher side of the oblique baffle 15 is fixedly bonded to a sidewall 16 of the cleaning chamber.

The splash shield 11 can act to prevent deionized water sprayed out of the spraying device 200 from being splashed on the liquid knife 14, the oblique baffle 15 and a substrate 13 to be cleaned, and also serve a certain isolating function on water vapor outside the shield at the same time. There is no limit on the concrete shape of the splash shield 11, and in technical solutions of embodiments illustrated in FIG. 2 to FIG. 4, the splash shield 11 takes the shape of "L", and it includes a top plate 11a and a side plate 11b, wherein, the top plate 11a is fixed to a sidewall 16 of the cleaning chamber.

As illustrated in FIG. 2, the substrate 13 is transferred to the left side along the arrow direction as illustrated in the figure (a delivery roll 10 is rotated counterclockwise). The liquid knife 14 is disposed under the splash shield 11 and gets close to the side plate 11b of the splash shield 11, namely, it gets close to the exit of the liquid knife cleaning device 100'. The etching solution remaining on the substrate 13 is quickly rinsed out by means of jetting a deionized water curtain toward the substrate from the liquid knife 14. The substrate 13 is transferred to underneath of the spraying device 200, and proceeds with deionized water showering.

There is no limit on concrete shape of the oblique baffle 15, and it can be understood that, its width shall be larger than width of the substrate 13 (here, the width refers to a horizontal size perpendicular to the transferring direction of the substrate 13). For rendering a majority of water vapor isolated from the liquid knife 14 and the substrate 13, the position of the oblique baffle 15 may be as low as possible.

Figure 3:
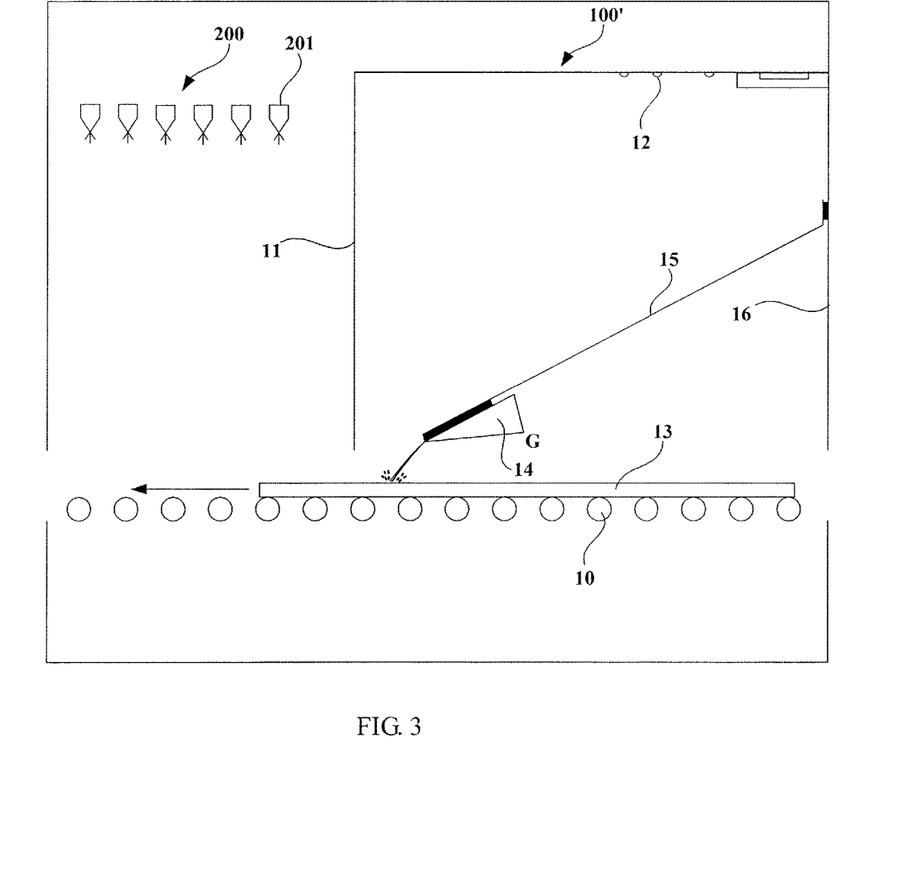
FIG. 3 is a structurally schematic view illustrating a cleaning equipment containing a liquid knife cleaning device according to another embodiment of the invention.

For example, as illustrated in FIG. 2, in the horizontal direction, the liquid knife 14 is close to the left side of the splash shield 11, and the oblique baffle 15 is fixed to the sidewall 16 of the cleaning chamber on the right side of the splash shield 11. That is, the splash shield includes a front side and a back side along the transferring direction of the substrate to be cleaned (the arrow direction as illustrated in FIG. 2 and FIG. 3), the liquid knife is close to the front side of the splash shield, and a higher side of the oblique baffle is close to the back side of the splash shield. Therefore, in the event that width of the oblique baffle 15 is larger than width of the substrate 13, a portion of the substrate that has not been cleaned can be fully sheltered by the oblique baffle 15, so as to prevent droplets from dripping on the portion of the substrate that has not been cleaned.

For example, the cleaning chamber includes a front side and a back side along the transferring direction of a substrate to be cleaned (the arrow direction illustrated in FIG. 2 and FIG. 3), the splash shield 11 is fixed to a sidewall (the sidewall 16) of the cleaning chamber on the back side. As such, droplets in the cleaning chamber can be further prevented from dripping on a portion of the substrate that has not been cleaned.

In technical solutions of embodiments of the invention, the oblique baffle 15 can act to isolate the liquid knife 14 and the substrate 13 on the delivery roll 10 from a majority of water vapor, and droplets 12 dripping on the oblique baffle 15 can flow down along a slope of the oblique baffle 15, and will not drip on the substrate 13 that has not been rinsed. As compared with prior art, effects of droplets on the uniformity of the substrate can be greatly reduced by the present scheme, thereby enhancing the product quality.

Figure 4:
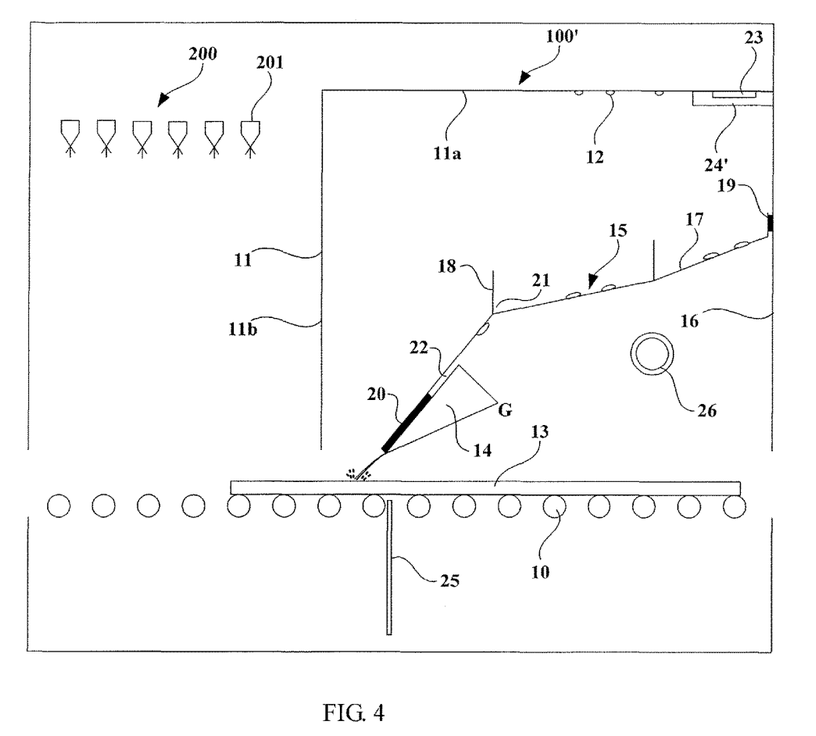
FIG. 4 is a structurally schematic view illustrating a cleaning equipment containing a liquid knife cleaning device according to still another embodiment of the invention.

As illustrated in FIG. 3, the body of an oblique baffle 15 may be a flat plate. In embodiments illustrated in FIG. 2 and FIG. 4, the oblique baffle 15 may also include at least two plate units 17; a vertical baffle 18 is disposed at the intersection of top surfaces of two adjacent flat units 17, and a first guiding slot 21 (V-shaped slot) is formed by the vertical baffle 18 and a flat unit in a higher section. Droplets dripping on the flat unit in a higher section can flow into the first guiding slot 21 under the action of gravity, and is quickly discharged toward two sides of the liquid knife cleaning device 100' (the water discharging direction is perpendicular to the direction of the plane of the figure). The number of flat units 17 may be designed according to an actual space within the splash shield 11. As illustrated in FIG. 4, in the embodiment, the oblique baffle 15 include three plate units 17, and vertical baffles 18 are disposed at the intersections of top surfaces of two adjacent plate units 17.

A higher side of the oblique baffle 15 and a sidewall 16 of the cleaning chamber may be fixed bonded by a fastener. Please continue to refer to that illustrated in FIG. 2, in the embodiment, there is a first sealing gasket 19 between the higher side of the oblique baffle 15 and the sidewall 16 of the cleaning chamber. The first sealing gasket 19 can act to prevent droplets from flowing down from a gap between the oblique baffle 15 and the sidewall 16 of the cleaning chamber, and thus, droplets are prevented from dripping on the substrate 13 and making a harmful effect on uniformity of the substrate.

In addition, there is a second sealing gasket 20 between a lower side of the oblique baffle 15 and the top of a blade of the liquid knife 14. A second guiding slot 22 is formed between the oblique baffle 15, the second sealing gasket 20 and the top of the blade of the liquid knife 14. When there are condensed droplets on a bottom surface of the oblique baffle 15, droplets can flow into the second guiding slot 22 under the action of gravity, and are quickly discharged to two sides of the liquid knife cleaning device 100'.

In prior art, as illustrated in FIG. 1, deionized water is too apt to seep into a gap between the splash shield 11 and the supporting plate 24, and uniformity of the substrate will also be affected by these deionized water when they drip on the substrate 13. In turn, the product quality is affected. Aiming for this technical problem, in a preferred embodiment of the invention as illustrated in FIG. 2, the liquid knife cleaning device 100' may further include a supporting plate 24' fixed bonded to a sidewall 16 of the cleaning chamber, with a third guiding slot 23 on a top surface of the supporting plate 24'; a top plate 11a of the splash shield 11 is fixedly bonded to the top surface of the supporting plate 24'. The top plate 11a of the splash shield 11 and the supporting plate 24' may be fixedly bonded by a fastener. When deionized water seeps into a gap between the splash shield 11 and the supporting plate 24', it can be quickly discharged to two sides of the liquid knife cleaning device 100' through the third guiding slot 23. There is no limit on the concrete shape of the third guiding slot 23, it may be a U-shaped slot, a V-shaped slot, a rectangle-shaped slot or the like. In addition, the top plate 11a of the splash shield 11 may also be directly bonded to the sidewall 16 of the cleaning chamber in a sealing manner, so as to isolate droplets generated by spraying in the outside of the splash shield 11.

When the liquid knife 14 just starts, a deionized water curtain sprayed out of it is not homogeneous and stable enough, and thus is not suitable for rinsing a substrate. The usual practice is to make the liquid knife 14 starting for a period of time, and after the deionized water curtain gets homogeneous and stable, to transfer the substrate 13 to the underneath of the liquid knife cleaning device 100' for cleaning. As illustrated in FIG. 1, in prior art, the blade of a liquid knife 14 faces a delivery roll 10, and when no substrate is placed on the delivery roll 10, splashback will be generated under impingement of deionized water curtain on the delivery roll 10. This aggravates generation of water vapor within the splash shield 11, and thus makes a harmful impact on the product quality. As illustrated in FIG. 2 to FIG. 4, in technical solutions of embodiments of the invention, the blade of liquid knife 14 faces a gap between two adjacent delivery rolls 10. As such, when no substrate is placed on the delivery rolls 10, delivery rolls 10 will not be impinged by deionized water curtain sprayed out of the blade of the liquid knife 14, and then splashback of liquid is reduced. In turn, generation of water vapor is effectively reduced.

In addition, in order to further strengthen anti-splashback effects, the liquid knife cleaning device 100' may further include a vertical baffle 25 located under the blade of the liquid knife 14, and height of the vertical baffle 25 should be lower than the delivery plane of the delivery rolls 10. Splashback of liquid can be effectively reduced by provision of the vertical baffle 25, so as to reduce generation of water vapor.

Figure 5:
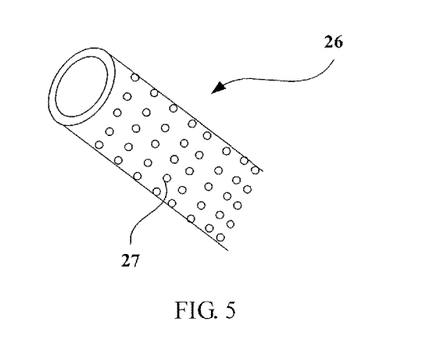
FIG. 5 is a structurally schematic view illustrating a blow-off pipe in an embodiment.
Figure 6:
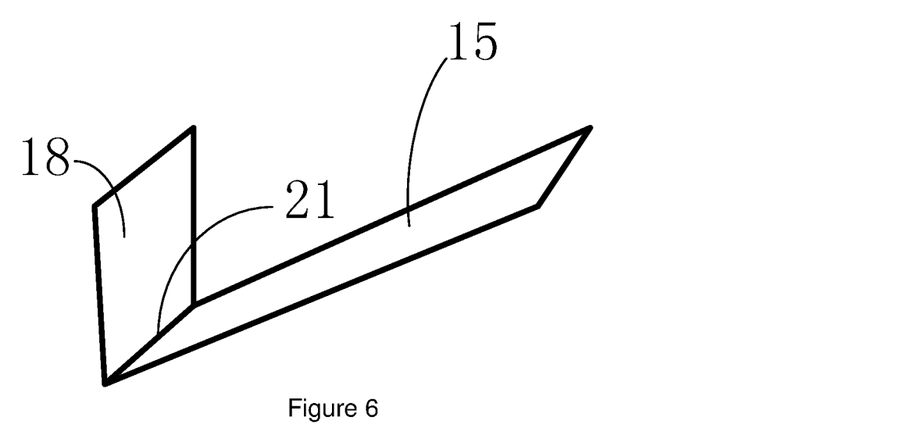
FIG. 6 is a three-dimensional view illustrating a structure of a first guiding slot in an embodiment.
Figure 7:
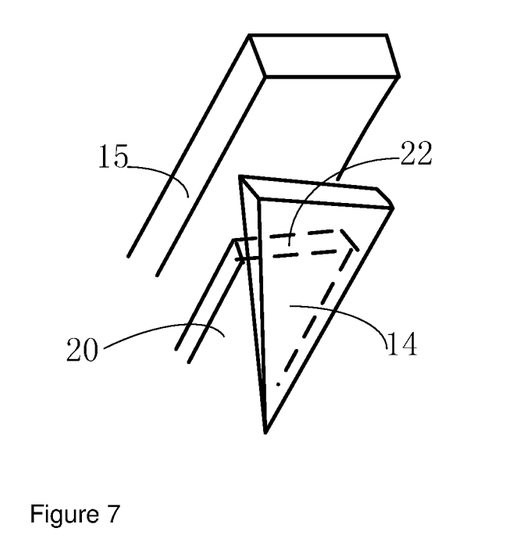
FIG. 7 is a three-dimensional view illustrating a structure of a second guiding slot in an embodiment.

As illustrated in FIG. 2 and FIG. 4, as a preferred scheme of embodiments of the invention, the liquid knife cleaning device 100' may further include a blow-off pipe 26 that is located under the oblique baffle 15 and above delivery rolls 10; and an air blasting device (not illustrated in the figure) for blasting airflow into the blow-off pipe 26. The air blasting device can act to blast dry and cold airflow into the blow-off pipe 26 when no substrate is placed on delivery rolls 10, so that water vapor underneath the oblique baffle 15 is blown off by the blow-off pipe 26, and condensation of droplets is decreased. As illustrated in FIG. 5, more preferably, a plurality of vent holes 27 are distributed along a pipe wall of the blow-off pipe 26, and dry and cold airflow blasted into the blow-off pipe 26 may be blown out from the plurality of vent holes 27. Thus, water vapor underneath the oblique baffle 15 can be blown off in multiple directions, and the blowing-off effect is better. With this scheme, condensed droplets are not easily to occur even at a G corner of the liquid knife 14.

It is worth mentioning that, technical solutions provided by embodiments of the invention may also be used in other similar cleaning processes. Condensed droplets are not easily to occur underneath the oblique baffle, and thus the impact on the process or the produce quality that is made by droplet dripping is reduced.

The descriptions made above are merely exemplary embodiments of the invention, but are not used to limit the protection scope of the invention. The protection scope of the invention is determined by attached claims.

This application claims the benefit of priority from Chinese patent application No. 201410682980.8, filed on Nov.

24, 2014, the disclosure of which is incorporated herein in its entirety by reference as a part of the present application.

The invention claimed is:

1. A liquid knife cleaning device, comprising:
a splash shield;
a liquid knife, which is located under the splash shield;
an oblique baffle, which is located between the splash shield and the liquid knife and is oblique relative to a top plate of the splash shield;
wherein, the oblique baffle at least includes a higher section plate and a lower section plate, and a lower end of the lower section plate is fixedly connected to a top of a blade of the liquid knife;
wherein, the splash shield, the liquid knife and the oblique baffle are located in a cleaning chamber, the splash shield is fixed to a sidewall of the cleaning chamber, and a higher end of the higher section plate is fixedly connected to the sidewall of the cleaning chamber;
wherein, the higher section plate and the lower section plate have different angle of inclination respectively;
wherein, a vertical baffle is disposed on an intersection where top surfaces of the higher section plate and the lower section plate meet each other, the higher end of the higher section plate is connected to the sidewall of the cleaning chamber, the lower end of the lower section plate is connected to the liquid knife, and a guiding slot on a top surface of the oblique baffle is formed by the vertical baffle and the higher section plate, the guiding slot on the top surface of the oblique baffle is used to guide deionized water drip on the top surface of the higher section plate out of the liquid knife cleaning device.

2. The liquid knife cleaning device according to claim 1, wherein, there is a first sealing gasket between the higher end of the higher section plate and the sidewall of the cleaning chamber.

3. The liquid knife cleaning device according to claim 1, wherein, there is a second sealing gasket between a lower end of the lower section plate and the liquid knife, and a lower surface of the lower section plate facing to the liquid knife is connected and sealed with a sidewall of the liquid knife through the second sealing gasket,
and a guiding slot on a lower surface of the oblique baffle, used to guide deionized water drip on the lower surface of the lower section plate out of the liquid knife cleaning device, is formed with a space which is constructed by a top side of the second sealing gasket, the lower section plate and a part of the sidewall of the liquid knife which is facing to the lower section plate and higher than the second sealing gasket.

4. The liquid knife cleaning device according to claim 1, further comprising a supporting plate fixedly connected to the sidewall of the cleaning chamber, there is a guiding slot on a top surface of the supporting plate, used to guide deionized water seeps into a gap between the splash shield and the supporting plate; a top plate of the splash shield is fixedly connected to the top surface of the supporting plate.

5. The liquid knife cleaning device according to claim 1, wherein, the blade of the liquid knife faces a gap between two adjacent delivery rolls.

6. The liquid knife cleaning device according to claim 1, further comprising a vertical baffle located under the blade of the liquid knife, and a height of the vertical baffle is lower than a delivery plane of delivery rolls.

7. The liquid knife cleaning device according to claim 1, further comprising:
a blow-off pipe located below the oblique baffle and above delivery rolls; and an air blasting device for blasting airflow into the blow-off pipe.

8. The liquid knife cleaning device according to claim 7, wherein, there is a plurality of vent holes distributed in a wall of the blow-off pipe.

9. The liquid knife cleaning device according to claim 1, wherein, the splash shield includes a front side and a back side along a transferring direction of a substrate to be cleaned, the liquid knife is closer to the front side than the back side of the splash shield, and a higher side of the higher section plate is closer to the back side than the front side of the splash shield.

10. The liquid knife cleaning device according to claim 1, wherein, the cleaning chamber includes a front side and a back side along a transferring direction of a substrate to be cleaned, and the splash shield is fixed to the sidewall of the cleaning chamber on the back side.

11. The liquid knife cleaning device according to claim 2, wherein, there is a second sealing gasket between a lower end of the lower section plate and the liquid knife, and a lower surface of the lower section plate facing to the liquid knife is connected and sealed with a sidewall of the liquid knife through the second sealing gasket,
and a guiding slot on a lower surface of the oblique baffle, used to guide deionized water drip on the lower surface of the lower section plate out of the liquid knife cleaning device, is formed with a space which is constructed by a top side of the second sealing gasket, the lower section plate and a part of the sidewall of the liquid knife which is facing to the lower section plate and higher than the second sealing gasket.

12. The liquid knife cleaning device according to claim 1, wherein, the blade of the liquid knife faces a gap between two adjacent delivery rolls.

13. The liquid knife cleaning device according to claim 2, wherein, the blade of the liquid knife faces a gap between two adjacent delivery rolls.

14. The liquid knife cleaning device according to claim 1, further comprising a vertical baffle located under the blade of the liquid knife, and a height of the vertical baffle is lower than a delivery plane of delivery rolls.

15. The liquid knife cleaning device according to claim 1, further comprising:
a blow-off pipe located below the oblique baffle and above delivery rolls; and an air blasting device for blasting airflow into the blow-off pipe.

* * * * *